(12) United States Patent
Choi et al.

(10) Patent No.: US 7,916,566 B2
(45) Date of Patent: *Mar. 29, 2011

(54) VOLTAGE CONTROL APPARATUS AND METHOD OF CONTROLLING VOLTAGE USING THE SAME

(75) Inventors: Jun-Gi Choi, Gyeonggi-do (KR); Yoon-Jae Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/364,670

(22) Filed: Feb. 3, 2009

(65) Prior Publication Data
US 2009/0141572 A1 Jun. 4, 2009

Related U.S. Application Data

(63) Continuation of application No. 11/822,358, filed on Jul. 5, 2007, now Pat. No. 7,502,268.

(30) Foreign Application Priority Data
Oct. 13, 2006 (KR) .................. 10-2006-0099652

(51) Int. Cl.
G11C 7/00 (2006.01)
(52) U.S. Cl. .................. 365/201; 365/189.09; 365/226
(58) Field of Classification Search .................. 365/204
See application file for complete search history.

(56) References Cited

U.S. PATENT DOCUMENTS

| | | | |
|---|---|---|---|
| 5,113,374 A * | 5/1992 | Matsui | 365/227 |
| 5,263,031 A | 11/1993 | Inoue | |
| 5,528,548 A | 6/1996 | Horiguchi et al. | |
| 5,687,180 A | 11/1997 | Kawasaki | |
| 5,901,105 A | 5/1999 | Ong et al. | |
| 5,910,926 A * | 6/1999 | Hashimoto | 365/230.03 |
| 5,970,007 A * | 10/1999 | Shiratake | 365/207 |
| 6,084,800 A * | 7/2000 | Choi et al. | 365/185.23 |
| 6,185,137 B1 | 2/2001 | Sato et al. | |
| 6,301,150 B1 * | 10/2001 | Kanamitsu et al. | 365/185.03 |
| 6,324,113 B1 * | 11/2001 | Tomita | 365/222 |
| 6,449,208 B1 | 9/2002 | Kono et al. | |
| 6,504,774 B2 * | 1/2003 | Yoon et al. | 365/203 |
| 6,549,449 B2 * | 4/2003 | Takashima | 365/149 |
| 6,563,746 B2 | 5/2003 | Fujioka et al. | |
| 6,940,765 B2 | 9/2005 | Kyung | |
| 7,227,794 B2 * | 6/2007 | Kang | 365/193 |

FOREIGN PATENT DOCUMENTS

| | | |
|---|---|---|
| JP | 9106698 | 4/1997 |
| JP | 2005071582 | 3/2005 |

OTHER PUBLICATIONS

"Deep Power Down", Technical Note No. E0598E31, Elpida Memory Inc., 2006.

* cited by examiner

*Primary Examiner* — Tan T. Nguyen
(74) *Attorney, Agent, or Firm* — Venable LLP; Jeffri A. Kaminski

(57) ABSTRACT

A voltage control apparatus and a method of controlling a voltage using the same. A voltage control apparatus includes a signal generator configured to output a burn-in control signal and a burn-in precharge signal in response to an all bank precharge command, and a voltage controller configured to supply either a first voltage or a second voltage lower than the first voltage to a word line in response to the burn-in control signal and the burn-in precharge signal.

16 Claims, 8 Drawing Sheets

A0-W0-W1-W2 ••• W(N-1)-W(N)-P0
A1-W0-W1-W2 ••• W(N-1)-W(N)-P1
A2-W0-W1-W2 ••• W(N-1)-W(N)-P2

⋮

A(N-1)-W0-W1-W2 ••• W(N-1)-W(N)-P(N-1)
A(N)-W0-W1-W2 ••• W(N-1)-W(N)-P(N)

VOLTAGE CONTROL APPARATUS AND METHOD OF CONTROLLING VOLTAGE USING THE SAME

CROSS-REFERENCE TO RELATED PATENT APPLICATION

This application is a continuation of U.S. patent application Ser. No. 11/822,358, filed Jul. 5, 2007 now U.S. Pat. No. 7,502,268, the subject matter of which application is incorporated herein by reference in its entirety.

This application claims the benefit of Korean Patent Application No. 10-2006-0099652, filed on Oct. 13, 2006, in the Korean Intellectual Property Office, the disclosure of which is incorporated herein in its entirety by reference.

BACKGROUND OF THE INVENTION

1. Technical Field

The present invention relates to a semiconductor integrated circuit. More particularly, the present invention relates to a voltage control apparatus using a burn-in test where a stress test is applied to weak cells and peripheral logics so as to detect defective elements in advance, and a method of controlling a voltage using the same.

2. Related Art

In general, semiconductor integrated circuits, for example, dynamic random access memories (DRAMs) are subjected to a burn-in test process that applies a stress to the DRAMs at a voltage higher than an operation voltage and a high temperature so as to detect defective elements in advance before a packaging process. If the burn-in test process is performed, it is possible to detect defective cells and logic circuits.

Further, during the burn-in test process, an excessive stress is applied to a dielectric film of storage capacitors of cells where a data signal is stored at a high potential so as to screen out defective cells therefrom. The stress is applied to a gate oxide film of cell transistors so as to determine whether electric breakdown occurs in the gate oxide film.

In order to perform the burn-in operation, a DRAM needs to have an active-write-precharge operation pattern. The operation of the DRAM is divided into a row-fast (X-Fast) operation and a column-fast (Y-Fast) operation according to row address (X-Address) and column address (Y-Address) scan methods.

FIG. 1 is a conceptual diagram illustrating an address proceeding direction and an address pattern according to a row-fast (X-Fast) operation, and FIG. 2 is a conceptual diagram illustrating an address proceeding direction and an address pattern according to a column-fast (Y-Fast) operation.

In FIGS. 1 and 2, A0 to A(N) indicate active commands, W0 to W(N) indicate write commands, and P0 to P(N) indicate precharge commands.

When comparing structures shown in FIGS. 1 and 2, the number of times of active-precharge during a row-fast (X-Fast) operation is n times larger than that during a column-fast (Y-Fast) operation. This means that an amount of peak current is large during an active operation or a precharge operation.

That is, in the case of the column-fast (Y-Fast) operation, according to an active-precharge method, after a row address is activated, a write operation is performed such that the number of times of the write operation is as many times as the number of columns, and a precharge operation is performed. For this reason, a peak current according to the operation of a word line WL during the column-fast (Y-Fast) operation becomes 1/N times smaller than that during the row-fast (X-Fast) operation.

FIG. 3 is a timing diagram illustrating an active-precharge method when a voltage control apparatus according to the related art performs a row-fast (X-Fast) operation.

As shown in FIG. 3, in the general voltage control apparatus, if an active command ACT is input, an active signal ACTIVE is generated, and a potential of the word line WL is increased to a level of a bootstrapping voltage VPP according to the active signal ACTIVE. Since the word line WL that is discharged to a ground voltage VSS needs to be charged to the level of the bootstrapping voltage VPP, a large amount of current is instantaneously consumed.

In FIG. 3, reference character A indicates an instantaneous peak current that is generated according to the operation of a word line WL during an active operation, and reference character B indicates a peak current that is generated during a precharge operation. Reference character C indicates a peak current that is generated according to the operation of a sense amplifier.

However, as the capacity of a DRAM increases, the amount of operation current that flows through the DRAM increases. In particular, in the case of the burn-in test where an active-precharge operation is repeated for 48 to 72 hours with an external voltage VDD higher than an operation voltage, a large amount of peak current is generated during a row-fast (X-Fast) operation. The large amount of peak current causes a solder ball functioning as an external signal terminal to be melted during a packaging process of a semiconductor memory apparatus, which lowers a package yield and damages a burn-in socket.

According to another method in the related art, an amount of peak current is reduced by using an active-precharge method during a column-fast (Y-Fast) operation. However, when the burn-in test is performed through the column-fast (Y-Fast) operation, a peri-transistor formed in a peripheral region may be deteriorated, and it is difficult to accurately screen out defects of the peri-transistor.

SUMMARY OF THE INVENTION

An embodiment of the invention may provide a voltage control apparatus that is capable of preventing a high concentration of a peak current.

Another embodiment of the invention may provide a method of controlling a voltage that is capable of allowing a burn-in test process to be performed without causing elements to be deteriorated.

An embodiment of the present invention may provide a voltage control apparatus. The voltage control apparatus may include a signal generator that outputs a burn-in control signal and a burn-in precharge signal in response to an all bank precharge command, and a voltage controller that may supply either a first voltage or a second voltage lower than the first voltage to a word line in response to the burn-in control signal and the burn-in precharge signal.

DESCRIPTION OF EXEMPLARY EMBODIMENT

Embodiments of the present invention will now be described more fully with reference to the accompanying drawings, in which exemplary embodiments of the invention are shown. The invention may, however, be embodied in many different forms and should not be construed as being limited to an embodiments set forth herein; rather, these embodiments are provided so that this disclosure will be thorough and complete, and will fully convey the concept of the invention to those skilled in the art.

Figure 1:
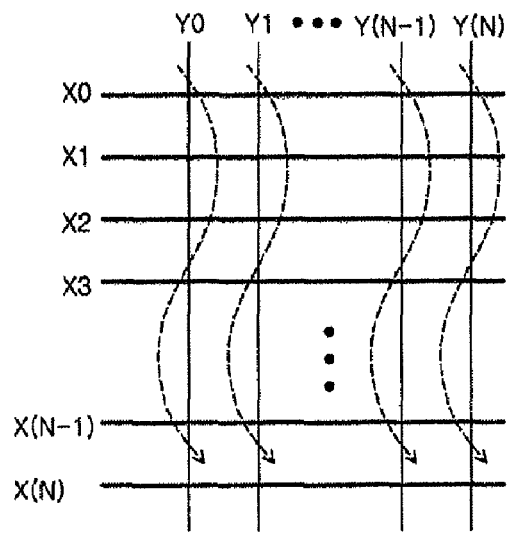
FIG. 1 is a conceptual diagram illustrating an address proceeding direction and an address pattern according to a row-fast (X-Fast) operation of a general DRAM.
Figure 1:
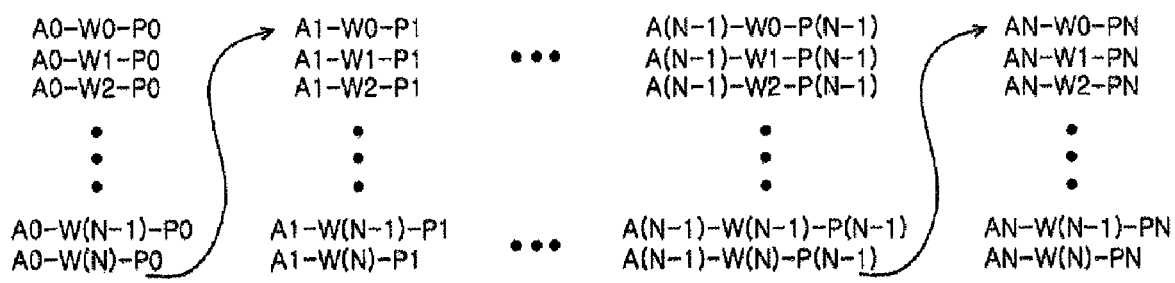
Figure 2:
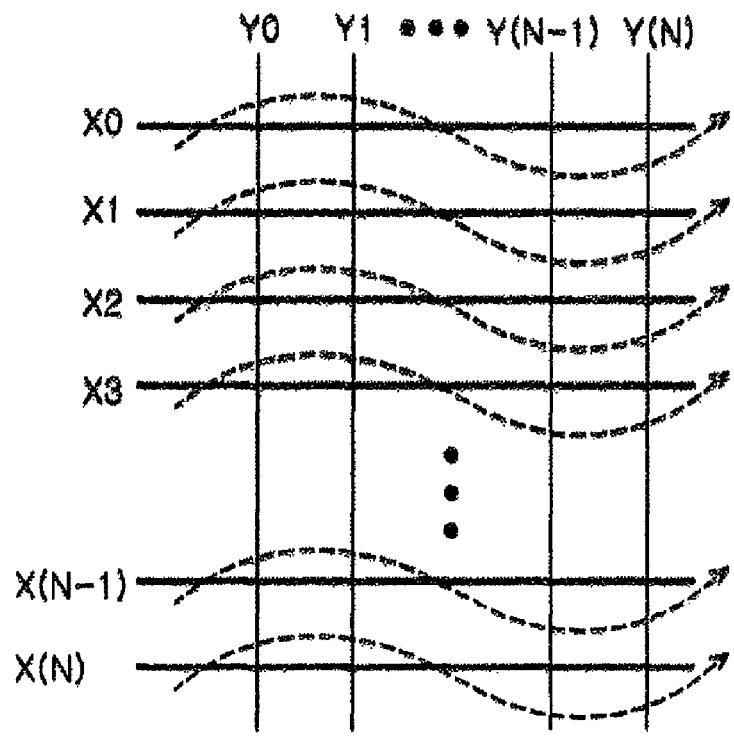
FIG. 2 is a conceptual diagram illustrating an address proceeding direction and an address pattern according to a column-fast (Y-Fast) operation of the general DRAM.
Figure 3:
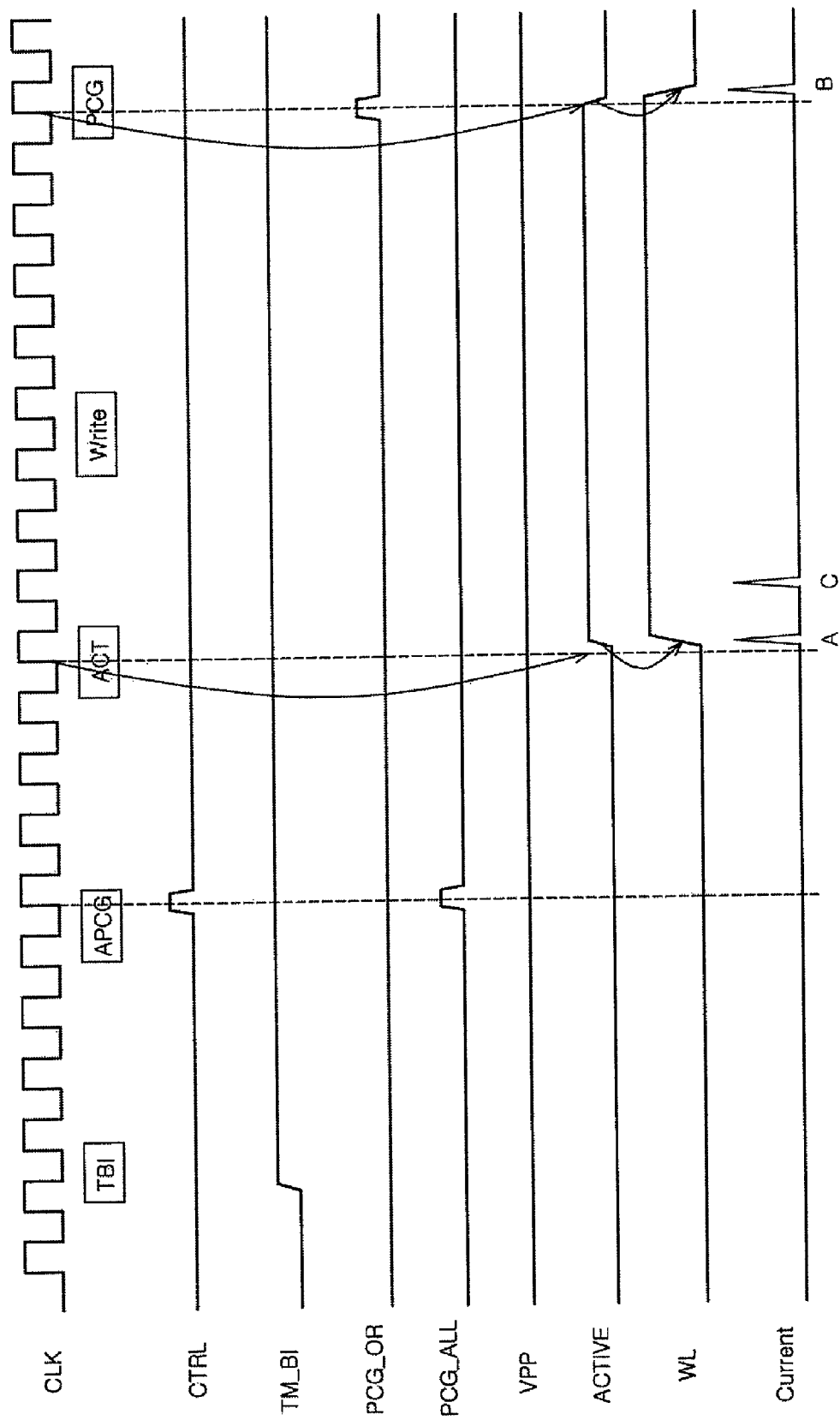
FIG. 3 is a timing diagram illustrating an active-precharge method in a case where a voltage control apparatus according to the related art performs a row-fast (X-Fast) operation.
Figure 4:
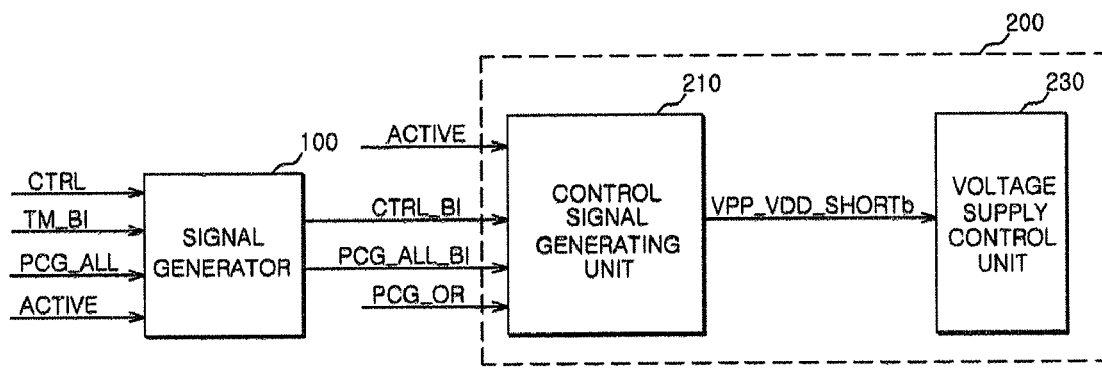
FIG. 4 is a block diagram illustrating an exemplary voltage control apparatus according to an embodiment of the present invention.
Figure 5:
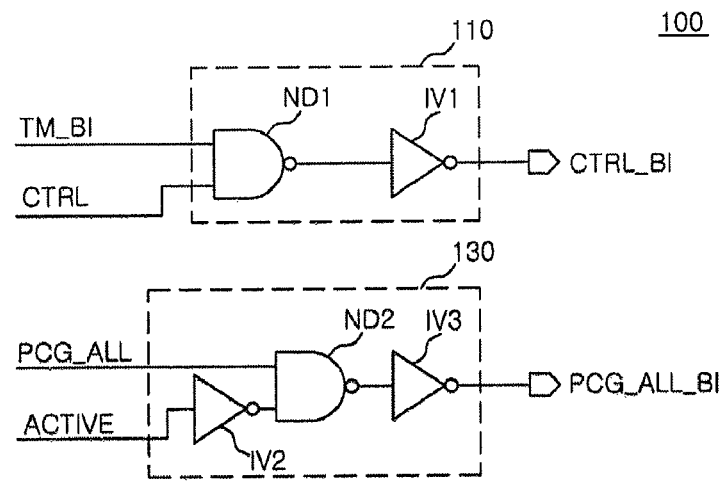
FIG. 5 is an internal circuit diagram of an exemplary signal generating unit shown in FIG. 4.

Referring to FIG. 4, a voltage control apparatus according to an embodiment of the present invention may include a signal generator 100 and a voltage controller 200.

The signal generator 100 generates a burn-in control signal CTRL_BI and a burn-in precharge signal PCG_ALL_BI in response to an all bank precharge command (not shown). This signal generator 100 includes a first signal generating unit 110 and a second signal generating unit 130.

The first signal generating unit 110 outputs the burn-in control signal CTRL_BI in response to a burn-in test mode signal TM_BI and a control signal CTRL. The first signal generating unit 110 includes a first NAND gate ND1 that receives the burn-in test mode signal TM_BI and the control signal CTRL. Further, the first signal generating unit 110 includes a first inverter IV1 that inverts an output signal of the first NAND gate ND1 to output the inverted signal as the burn-in control signal CTRL_BI. The first signal generating unit 110 may be composed of a logic element that receives the burn-in test mode signal TM_BI and the control signal CTRL and performs an AND operation on the received signals, that is, an AND gate. The burn-in test mode signal TM_BI is activated during a burn-in test mode, and the control signal CTRL is activated when an all bank precharge command is input and may be a specific address signal.

The second signal generating unit 130 outputs the burn-in precharge signal PCG_ALL_BI in response to the second precharge signal PCG_ALL and the active signal ACTIVE. The second signal generating unit 130 includes a second inverter IV2 that inverts the active signal ACTIVE, a second NAND gate ND2 that receives the second precharge signal PCG_ALL and an output signal of the second inverter IV2, and a third inverter IV3 that inverts an output signal of the second NAND gate ND2 and outputs it as a burn-in precharge signal PCG_ALL_BI.

Meanwhile, in response to the burn-in control signal CTRL_BI and the burn-in precharge signal PCG_ALL_BI, the voltage controller 200 supplies either a first voltage VPP or a second voltage VDD lower than the first voltage VPP to a word line WL. The voltage controller 200 may further receive a first precharge signal PCG_OR and an active signal ACTIVE. That is, the voltage controller 200 outputs the first voltage VPP or the second voltage VDD in response to the first precharge signal PCG_OR, the active signal ACTIVE, the burn-in control signal CTRL_BI, and the burn-in precharge signal PCG_ALL_BI.

The voltage controller 200 includes a control signal generating unit 210 and a voltage supply control unit 230.

The control signal generating unit 210 outputs a voltage control signal VPP_VDD_SHORTb in response to the active signal ACTIVE, the first precharge signal PCG_OR, the burn-in precharge signal PCG_ALL_BI, and the burn-in control signal CTRL_BI. The first precharge signal PCG_OR precharges a part of a plurality of banks, and the second precharge signal PCG_ALL precharges all of the plurality of banks. For example, the first precharge signal PCG_OR is activated when a precharge command PCG is input, and the second precharge signal PCG_ALL is activated when an all bank precharge command APCG is input.

Figure 6:
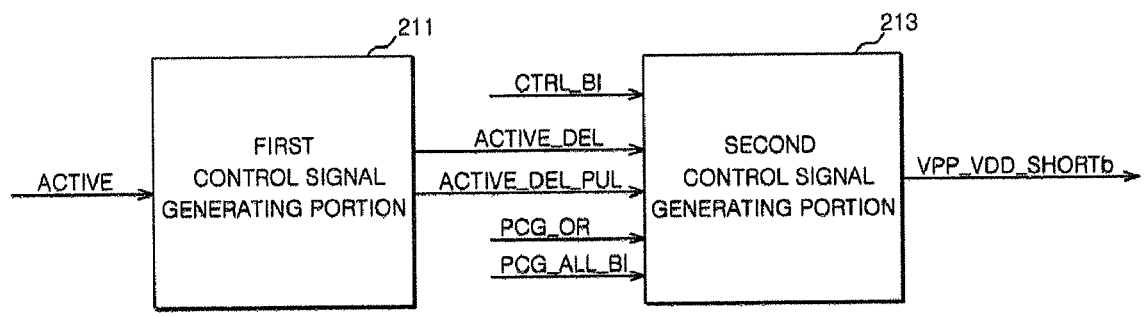
FIG. 6 is an internal block diagram of an exemplary control signal generating unit shown in FIG. 4.

As shown in FIG. 6, the control signal generating unit 210 may include a first control signal generating portion 211 and a second control signal generating portion 213. The first control signal generating portion 211 receives an active signal ACTIVE, generates an active delay signal ACTIVE_DEL obtained by delaying the active signal ACTIVE, and an active delay pulse signal ACTIVE_DEL_PUL that responds to the active delay signal ACTIVE_DEL.

Figure 7:
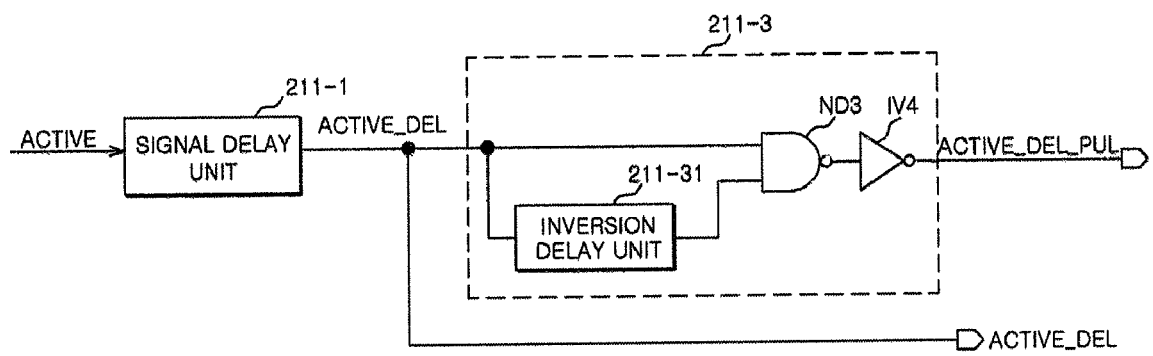
FIG. 7 is an internal circuit diagram of an exemplary first control signal generating portion shown in FIG. 6.

As shown in FIG. 7, the first control signal generating portion 211 includes a signal delay unit 211-1 and a pulse generating portion 211-3. The signal delay unit 211-1 delays the active signal ACTIVE by a first delay time td1 and generates the active delay signal ACTIVE_DEL. The pulse generating portion 211-3 generates an active delay pulse signal ACTIVE_DEL_PUL in response to the active delay signal ACTIVE_DEL. For example, the signal delay unit 211-1 includes a series of inverters. The pulse generating portion 211-3 includes an inversion delay unit 211-31 that inverts and delays the active delay signal ACTIVE_DEL by a second delay time td2, a third NAND gate ND3 that receives the active delay signal ACTIVE_DEL and an output signal of the inversion delay unit 211-31, and a fourth inverter IV4 that inverts an output signal of the third NAND gate ND3 and outputs it as the active delay pulse signal ACTIVE_DEL_PUL. In this embodiment, the pulse generating portion 211-3 includes the NAND gate and the inverter, but may include other logic elements to generate a pulse signal.

Meanwhile, the second control signal generating portion 213 generates the voltage control signal VPP_VDD_SHORTb in response to the first precharge signal PCG_OR, the burn-in precharge signal PCG_ALL_BI, the burn-in control signal CTRL_BI, the active delay signal ACTIVE_DEL, and the active delay pulse signal ACTIVE_DEL_PUL.

Figure 8:
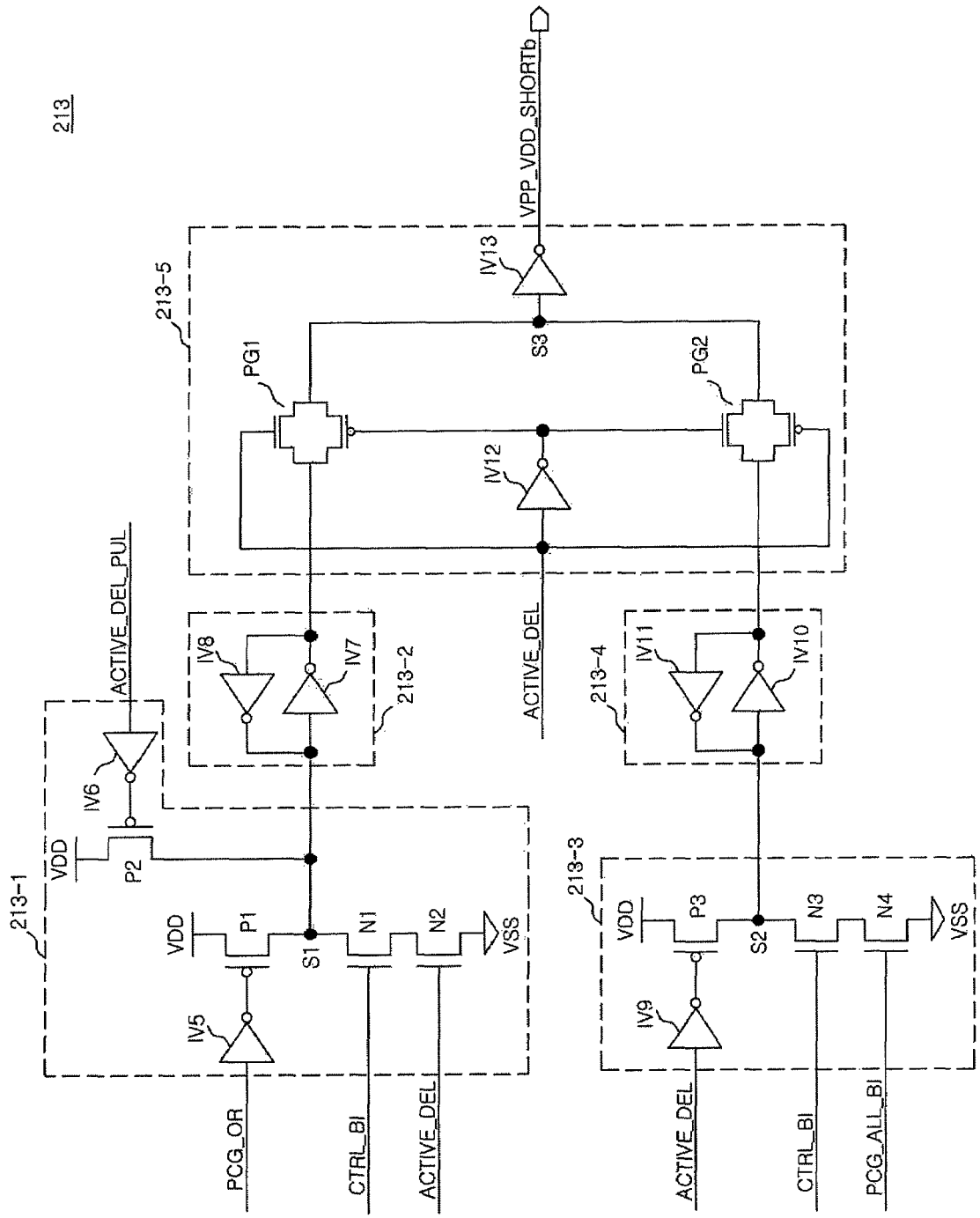
FIG. 8 is an internal circuit diagram of an exemplary second control signal generating portion shown in FIG. 6.

As shown in FIG. 8, the second control signal generating portion 213 includes a first signal input unit 213-1, a first latch unit 213-2, a second signal input unit 213-3, a second latch unit 213-4, and a signal driving unit 213-5.

The first signal input unit 213-1 changes a potential of a first node S1 in response to the first precharge signal PCG_OR, the burn-in control signal CTRL_BI, the active delay signal ACTIVE_DEL, and the active delay pulse signal ACTIVE_DEL_PUL. The first signal input unit 213-1 includes a fifth inverter IV5, a first transistor P1, a second transistor N1, a third transistor N2, a sixth inverter IV6, and a fourth transistor P2. The fifth inverter IV5 inverts the first precharge signal PCG_OR, and the first transistor P1 switches a second voltage VDD according to an output signal of the fifth inverter IV5. The second transistor N1 transmits the voltage of the first node S1 to the third transistor N2 in response to the burn-in control signal CTRL_BI, and the third transistor N2 transmits a voltage supplied by the second transistor N1 to a ground terminal VSS in accordance with an active delay signal ACTIVE_DEL. The sixth inverter IV6 inverts the active delay pulse signal ACTIVE_DEL_PUL, and the fourth transistor P2 transmits the second voltage VDD to the first node S1 in accordance with the output signal of the sixth inverter IV6.

The first latch unit 213-2 latches a potential of the first node S1. The first latch unit 213-2 includes seventh and eighth inverters IV7 and IV8.

The second signal input unit 213-3 changes a potential of the second node S2 in response to the burn-in precharge signal PCG_ALL_BI, the burn-in control signal CTRL_BI, and the active delay signal ACTIVE_DEL. The second signal input unit 213-3 includes a ninth inverter IV9, a fifth transistor P3, a sixth transistor N3, and a seventh transistor N4. The ninth inverter IV9 inverts the active delay signal ACTIVE_DEL, and the fifth transistor P3 transmits the second voltage VDD to the second node S2 in response to the output signal of the ninth inverter IV9. The sixth transistor N3 transmits a voltage of the second node S2 to the seventh transistor N4 in response to a burn-in control signal CTRL_BI, and the seventh transistor N4 transmits a voltage supplied by the sixth transistor N3 to a ground terminal VSS in response to the burn-in precharge signal PCG_ALL_BI.

The second latch unit 213-4 latches a potential of the second node S2. The second latch unit 213-4 includes a tenth inverter IV10 and an eleventh inverter IV11.

In response to the active delay signal ACTIVE_DEL, the signal driving unit 213-5 drives either an output signal of the first latch unit 213-2 or an output signal of the second latch unit 213-4 to output it as the voltage control signal VPP_VDD_SHORTb. The signal driving unit 213-5 includes a twelfth inverter IV12, a first switching element PG1, a second switching element PG2, and a thirteenth inverter IV13. The twelfth inverter IV12 inverts the active delay signal ACTIVE_DEL, and the first switching element PG1 transmits an output signal of the first latch unit 213-2 to the third node S3 in response to the active delay signal ACTIVE_DEL and the output signal of the twelfth inverter IV12. The second switching element PG2 transmits the output signal of the second latch unit 213-4 to the third node S3 according to the active delay signal ACTIVE_DEL and the output signal of the twelfth inverter IV12. The thirteenth inverter IV13 inverts a signal of the third node S3 and outputs it as the voltage control signal VPP_VDD_SHORTb. In this embodiment, each of the first switching element PG1 and the second switching element PG2 is composed of a pass gate, each of the first transistor P1, the fourth transistor P2, and the fifth transistor P3 is composed of a PMOS transistor, and each of the second transistor N1, the third transistor N2, the sixth transistor N3, and the seventh transistor N4 is composed of an NMOS transistor.

Figure 9:
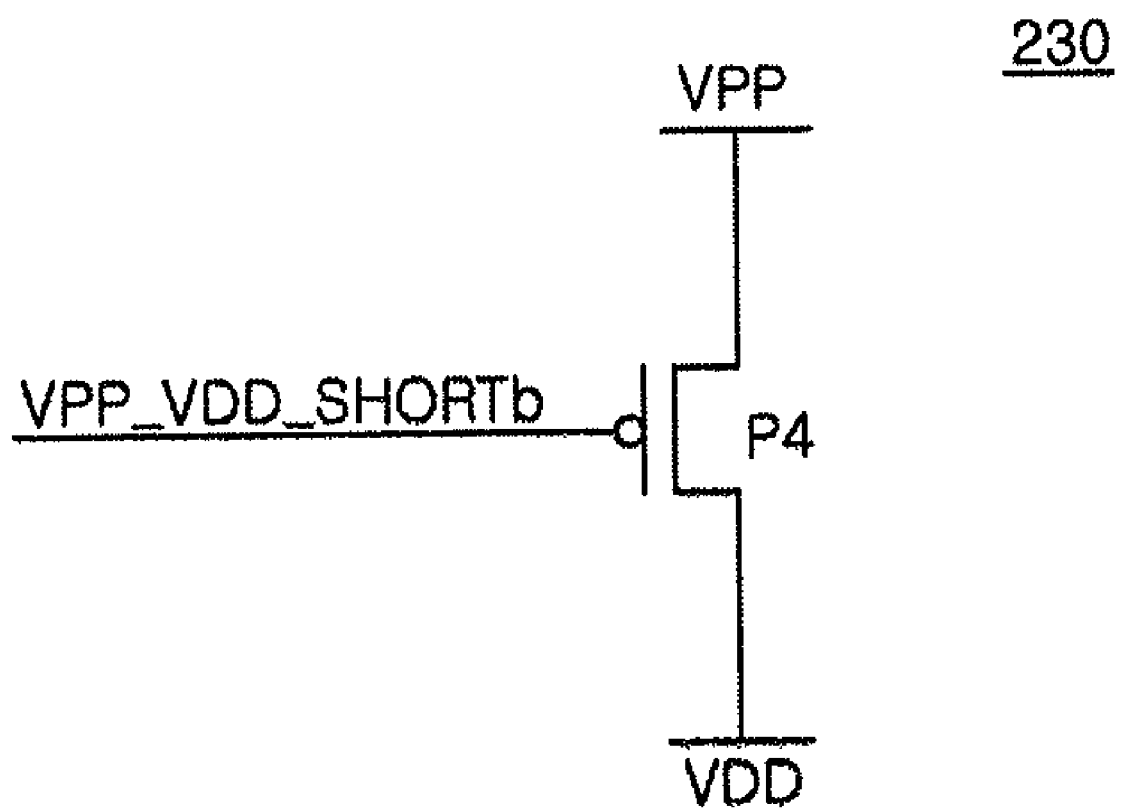
FIG. 9 is an internal circuit diagram of an exemplary voltage supply unit shown in FIG. 4.

Meanwhile, the voltage supply control unit 230 supplies either the first voltage VPP or the second voltage VDD lower than the first voltage VPP to the word line WL in response to the voltage control signal VPP_VDD_SHORTb. The second voltage VDD may be an external supply voltage supplied from the outside, and the first voltage VPP may be a voltage that is generated by pumping the second voltage VDD. As shown in FIG. 9, the voltage supply unit 230 may be composed of an eighth transistor P4 that shorts the first voltage VPP and the second voltage VDD in response to the voltage control signal VPP_VDD_SHORTb. The eighth transistor P4 may be replaced by a switching element that shorts the first voltage VPP and the second voltage VDD in response to the voltage control signal VPP_VDD_SHORTb.

According to one purpose of a designer, the voltage supply unit 230 may supply either the first voltage VPP or the second voltage VDD to the word line WL in response to the voltage control signal VPP_VDD_SHORTb, in a different method from the method according to the above-described embodiment.

Referring to FIGS. 4 to 10, the voltage control apparatus according to an embodiment of the present invention stabilizes each power at a predetermined voltage level after a semiconductor device enters a burn-in test mode. And then, the voltage control apparatus receives an all bank precharge command APCG before an active signal is input and performs a dummy all bank precharge operation. The all bank precharge operation means that a precharge operation is performed once more in the voltage control apparatus, and does not affect a normal operation. During the all bank precharge operation, since the control signal CTRL is an activated pulse signal, the signal generator 100 outputs the burn-in control signal CTRL_BI that is the activated pulse signal.

When the all bank precharge command APCG is applied, the second precharge signal PCG_ALL is activated at a high level, and the first precharge signal PCG_OR is maintained at a low level. Meanwhile, if the precharge command PCG is input, the first precharge signal PCG_OR is activated at a high level, and the second precharge signal PCG_ALL is maintained at a low level.

When the all bank precharge command APCG is applied in a state where the active signal ACTIVE is at a low level, the first precharge signal PCG_OR is maintained at a low level, and the active delay signal ACTIVE_DEL and the active delay pulse signal ACTIVE_DEL_PUL is maintained at a low level. Meanwhile, since the second precharge signal PCG_ALL and the burn-in control signal CTRL_BI are activated at a high level, the second signal generating unit 130 outputs the burn-in precharge signal PCG_ALL_BI at the high level.

Referring to FIG. 8, the sixth transistor N3 and the seventh transistor N4 are turned on in response to the burn-in control signal CTRL_BI and the burn-in precharge signal PCG_ALL_BI. As a result, the potential of the second node S2 is shifted to a low level and the second latch unit 213-4 maintains the potential of the second node S2 at a low level. Since the active delay signal ACTIVE_DEL is at a low level, the second pass gate PG2 is turned on, and the potential of the third node S3 becomes a high level and the voltage control signal VPP_VDD_SHORTb is shifted to a low level. In response to the voltage control signal VPP_VDD_SHORTb, the voltage supply unit 230 shorts the first voltage VPP and the second voltage VDD and pulls down the first voltage VPP to the second voltage VDD.

Then, when the active command ACT is input, the active signal ACTIVE is activated to a high level. The active signal ACTIVE is delayed by the signal delay unit 211-1 by the first delay time td1 and is then output as the active delay signal ACTIVE_DEL. The pulse generating unit 211-3 receives the active delay signal ACTIVE_DEL to output the active delay pulse signal ACTIVE_DEL_PUL that is a pulse signal having an activated interval as much as the second delay time td2.

The word line WL is activated in response to the active signal ACTIVE, and the potential of the word line WL is increased to the second voltage VDD for the first delay time td1. Meanwhile, when the active delay pulse signal ACTIVE_DEL_PUL is generated, the word line WL is increased to the first voltage VPP for the second delay time td2.

That is, if the active signal ACTIVE is activated during an interval where the voltage control signal VPP_VDD_SHORTb is at a low level, the word line WL is supplied with the second voltage VDD and increases to the second voltage VDD, for the first delay time td1. Then, since the voltage control signal VPP_VDD_SHORTb is shifted to a high level during an interval where the active delay pulse signal ACTIVE_DEL_PUL is activated, the potential of the word line WL is increased to the first voltage VPP for the second delay time td2.

This will be described in detail with reference to FIG. 8. During an interval where the active delay pulse signal ACTIVE_DEL_PUL is activated at a high level, the fourth transistor P2 is turned on and the first node S1 is shifted to a high level, and the first latch unit 213-2 maintains the first node S1 at a high level. Since the active delay signal ACTIVE_DEL is at a high level, the first pass gate PG1 is turned on, and the third node S3 maintains a low level. That is, the voltage control signal VPP_VDD_SHORTb is shifted to a high level.

Then, if the control signal CTRL has a dummy activation pulse according to the all bank precharge command APCG before the precharge command PCG, the first signal generating unit 110 outputs the burn-in control signal CTRL_BI as a pulse signal that is activated at a high level, and the second signal generating unit 130 outputs the burn-in precharge signal PCG_ALL_BI at the low level. When the control signal CTRL has a dummy activation pulse during a burn-in test mode, a DRAM can be operated in a normal state. For example, in FIG. 10, when a current mode is not a burn-in test mode as indicated by reference character D, the signal generator 100 receives the burn-in test mode signal TM_BI at the low level and the control signal CTRL at the high level, and outputs the burn-in control signal CTRL_BI at the low level as indicated by reference character E.

At this time, the second transistor N1 and the third transistor N2 are turned on in response to the burn-in control signal CTRL_BI and the active delay signal ACTIVE_DEL. As a result, the first node S1 is shifted to a low level, and the first latch unit 213-2 maintains the potential of the first node S1at a low level. The first pass gate PG1 is turned on in response to the active delay signal ACTIVE_DEL at the high level and the third node S3 is maintained at a high level, and the voltage control signal VPP_VDD_SHORTb is shifted to a low level by the thirteenth inverter IV13. Since the voltage supply unit 230 shorts the first voltage VPP and the second voltage VDD in response to the voltage control signal VPP_VDD_SHORTb, the potential of the word line WL is pulled down to the second voltage VDD. Then, if the precharge command PCG is input, the active signal ACTIVE is inactivated, and the word line WL is pulled down to the ground voltage VSS in response to the active signal ACTIVE. When the precharge command PCG is input, the first precharge signal PCG_OR has a pulse signal that is activated at a high level. As a result, the first transistor P1 is turned on and the potential of the first node S1 is shifted to a high level, and the first latch unit 213-2 maintains the potential of the first node S1 at a high level. At this time, since the active delay signal ACTIVE_DEL is maintained at a high level, the first pass gate PG1 is turned on, and the potential of the third node S3 is shifted to a low level. That is, the voltage control signal VPP_VDD_SHORTb is shifted to a high level.

As described above, when the voltage control apparatus according to an embodiment of the present invention drives the word line WL during an active operation, the voltage control apparatus increases the potential of the word line WL to the second voltage VDD, and drives the word line WL with the first voltage VPP higher than the second voltage VDD, thereby distributing a peak current. Further, the voltage control apparatus decreases the potential of the word line WL to the second voltage VDD level before performing the precharge operation and decreases the potential of the word line WL to the ground voltage VSS level, thereby distributing the peak current during the precharge operation.

Figure 10:
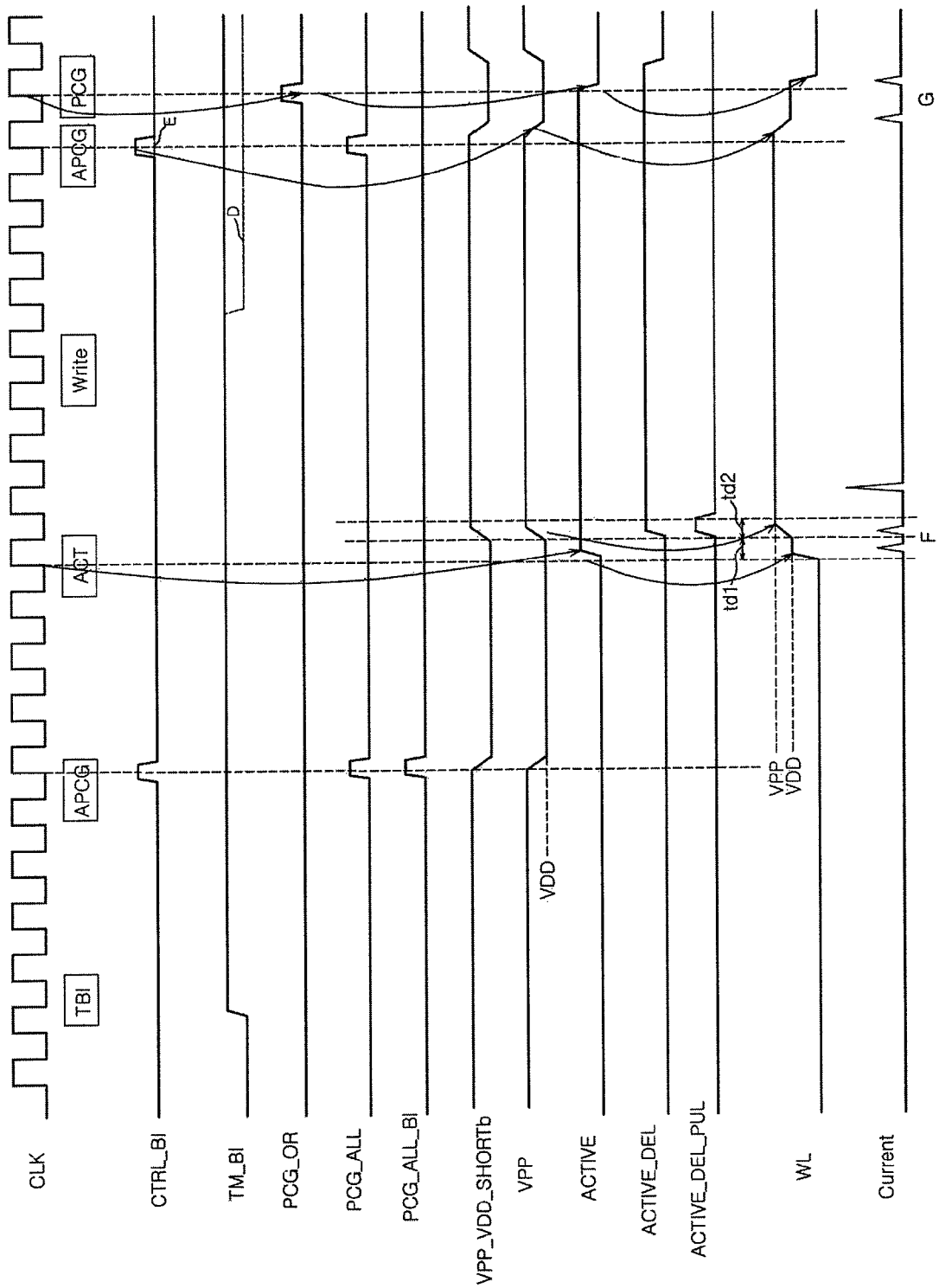
FIG. 10 is a timing diagram illustrating an active-precharge method in a case where a voltage control apparatus according to an embodiment of the present invention performs a row-fast (X-Fast) operation.

As shown in FIG. 10, reference character F indicates that the peak current is distributed during an active operation, and reference character G indicates that the peak current is distributed during a precharge operation.

The voltage control apparatus distributes the peak current generated during the active operation and the precharge operation so as to prevent the solder ball in a package from melting due to a high concentration of peak current, thereby improving productivity of a semiconductor memory apparatus and improving a burn-in screen capability.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A voltage control apparatus comprising:
   a controller configured to receive a precharge and an active signal and to increase a potential of a word line for distributing a peak current during an active operation in phases, and decrease the potential of the word line for distributing the peak current during a precharge operation.

2. The voltage control apparatus of claim 1,
   wherein the potential of the word line becomes and maintains a first voltage level for a predetermined time when the active operation is started, and then the potential of the word line increases from the first voltage level to a second voltage level higher than the first voltage level.

3. The voltage control apparatus of claim 2,
   wherein the first voltage level is a VDD and the second voltage level is a VPP.

4. The voltage control apparatus of claim 1,
   wherein the potential of the word line becomes and maintains a first voltage level for a predetermined time when the precharge operation is started, and then the potential of the word line decreases from the first voltage line to a third voltage level lower than the first voltage level.

5. The voltage control apparatus of claim 4,
   wherein the first voltage level is a VDD and the third voltage level is a VSS.

6. The voltage control apparatus of claim 1,
   wherein the controller includes:
   a signal generator configured to output a burn-in control signal and a burn-in precharge signal in response to an all bank precharge command; and
   a voltage controller configured to receive a first precharge signal and an active signal and supply either a first voltage level or a second voltage level higher than the first voltage level to the word line in response to the burn-in control signal and the burn-in precharge signal.

7. The voltage control apparatus of claim 6,
wherein the signal generator includes:
a first signal generating unit configured to output the burn-in control signal in response to a burn-in test mode signal and a control signal; and
a second signal generating unit configured to output the burn-in precharge signal in response to a second precharge signal and the active signal.

8. The voltage control apparatus of claim 7,
wherein the first signal generating unit is configured to receive the burn-in test mode signal and the control signal, and is configured to be enabled when both the burn-in test mode signal and the control signal are at a high level.

9. The voltage control apparatus of claim 7,
wherein the second signal generating unit includes:
a first inverter configured to invert the active signal to provide an output signal;
a NAND gate configured to receive the second precharge signal and the output signal of the first inverter, and to perform a NAND operation to provide an output signal; and
a second inverter configured to receive the output signal of the NAND gate to output the burn-in precharge signal.

10. The voltage control apparatus of claim 9,
wherein the burn-in test mode signal is activated during a burn-in test mode, and the control signal is activated in response to the all bank precharge command.

11. The voltage control apparatus of claim 10,
wherein the first precharge signal precharges a portion of a plurality of banks, and the second precharge signal precharges all of the plurality of banks.

12. The voltage control apparatus of claim 6,
wherein the voltage controller includes:
a control signal generating unit configured to output a voltage control signal in response to the active signal, the first precharge signal, the burn-in precharge signal, and the burn-in control signal; and
a voltage supply control unit that supplies either the first voltage level or the second voltage level to the word line in response to the voltage control signal.

13. The voltage control apparatus of claim 12,
wherein the control signal generating unit includes:
a first control signal generating portion configured to receive the active signal and to generate an active delay signal obtained by delaying the active signal, and to generate an active delay pulse signal in response to the active delay signal; and
a second control signal generating portion configured to generate the voltage control signal in response to the first precharge signal, the burn-in precharge signal, the burn-in control signal, the active delay signal, and the active delay pulse signal.

14. The voltage control apparatus of claim 13,
wherein the first control signal generating portion includes:
a signal delay unit configured to delay the active signal by a first delay time and to output the active delay signal; and
a pulse generating unit configured to output the active delay pulse signal in response to the active delay signal.

15. The voltage control apparatus of claim 14,
wherein the second control signal generating portion includes:
a first signal input unit configured to change a potential of a first node in response to the first precharge signal, the burn-in control signal, the active delay signal, and the active delay pulse signal;
a first latch unit configured to latch the potential of the first node to provide an output signal;
a second signal input unit configured to change a potential of a second node in response to the burn-in precharge signal, the burn-in control signal, and the active delay signal;
a second latch unit configured to latch the potential of the second node to provide an output signal; and
a signal driving unit configured to drive either the output signal of the first latch unit or the output signal of the second latch unit in response to the active delay signal and to output the output signal of the first latch unit or output signal of the second latch unit as the voltage control signal.

16. The voltage control apparatus of claim 12,
wherein the voltage supply control unit includes a switching element configured to short the first voltage level and the second level voltage in response to the voltage control signal.

* * * * *